(12) United States Patent
Jeyasingh et al.

(10) Patent No.: US 10,269,396 B2
(45) Date of Patent: Apr. 23, 2019

(54) TECHNIQUES TO MITIGATE BIAS DRIFT FOR A MEMORY DEVICE

(71) Applicant: Intel Corporation, Santa Clara, CA (US)

(72) Inventors: Rakesh Jeyasingh, Santa Clara, CA (US); Nevil N Gajera, Meridian, ID (US); Mase J. Taub, Folsom, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/036,756

(22) Filed: Jul. 16, 2018

(65) Prior Publication Data

US 2019/0057728 A1 Feb. 21, 2019

Related U.S. Application Data

(63) Continuation of application No. 15/415,690, filed on Jan. 25, 2017, now Pat. No. 10,026,460, which is a continuation of application No. 15/087,762, filed on Mar. 31, 2016, now Pat. No. 9,589,634.

(51) Int. Cl.
| | | |
|---|---|---|
| *G11C 13/00* | (2006.01) | |
| *G11C 7/12* | (2006.01) | |
| *G11C 11/16* | (2006.01) | |
| *G11C 11/56* | (2006.01) | |

(52) U.S. Cl.
CPC ............ *G11C 7/12* (2013.01); *G11C 11/1657* (2013.01); *G11C 11/1675* (2013.01); *G11C 13/0004* (2013.01); *G11C 13/0028* (2013.01); *G11C 13/0033* (2013.01); *G11C 13/0069* (2013.01); *G11C 11/5678* (2013.01); *G11C 2213/77* (2013.01)

(58) Field of Classification Search
CPC ............ G11C 13/0004; G11C 13/0069; G11C 11/5678
USPC ............................ 365/163, 148, 185.23, 196
See application file for complete search history.

(56) References Cited

U.S. PATENT DOCUMENTS

| | | |
|---|---|---|
| 7,196,931 B2 | 3/2007 | Cernea et al. |
| 7,471,565 B2 | 12/2008 | Aritome |
| 8,164,950 B2 | 4/2012 | Torsi et al. |
| 8,699,273 B2 | 4/2014 | Binboga |

(Continued)

OTHER PUBLICATIONS

Advisory Action for U.S. Appl. No. 15/415,690, dated Feb. 5, 2018, 3 pages.

(Continued)

*Primary Examiner* — Jason Lappas
(74) *Attorney, Agent, or Firm* — Compass IP Law PC

(57) ABSTRACT

Examples may include techniques to mitigate bias drift for memory cells of a memory device. A first memory cell coupled with a first word-line and a bit-line is selected for a write operation. A second memory cell coupled with a second word-line and the bit-line is de-selected for the write operation. First and second bias voltages are applied to the first word-line and the bit-line during the write operation to program the first memory cell. A third bias voltage is applied to the second word-line during the write operation to reduce or mitigate voltage bias to the second memory cell due to the second bias voltage applied to the bit-line to program the first memory cell.

23 Claims, 10 Drawing Sheets

System 100

(56) References Cited

U.S. PATENT DOCUMENTS

2014/0169089 A1* 6/2014 Castro .................... G11C 7/10
                                                    365/163
2014/0301139 A1   10/2014 Hirose et al.
2015/0055407 A1*  2/2015 Mantegazza ....... G11C 13/0069
                                                    365/163

OTHER PUBLICATIONS

Corrected Notice of Allowance for U.S. Appl. No. 15/087,762, dated Dec. 13, 2016, 5 pages.
Final Office Action for U.S. Appl. No. 15/415,690, dated Jul. 18, 2017, 10 pages.
Final Office Action for U.S. Appl. No. 15/415,690, dated Oct. 30, 2017, 11 pages.
International Search Report and Written Opinion for PCT Patent Application No. PCT/US2017/013662, dated Apr. 25, 2017, 11 pages.
Notice of Allowance for U.S. Appl. No. 15/087,762, dated Oct. 27, 2016, 10 pages.
Office Action for U.S. Appl. No. 15/415,690, dated Apr. 4, 2017, 9 pages.

\* cited by examiner

Distributions 300
Threshold Voltage Distribution 310
(Pre-Drift)
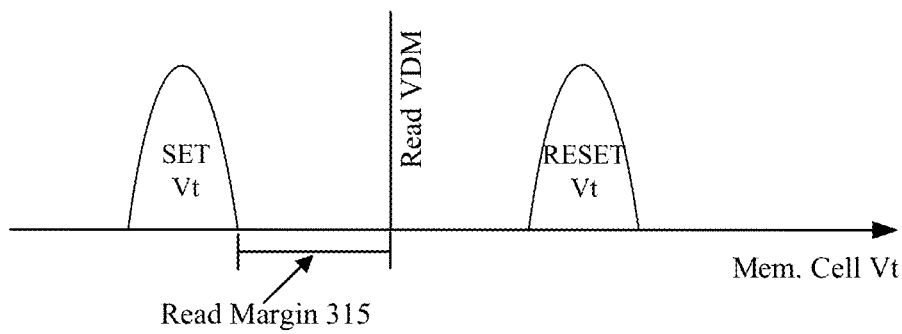
Read Margin 315
Threshold Voltage Distribution 320
(Post-Drift)
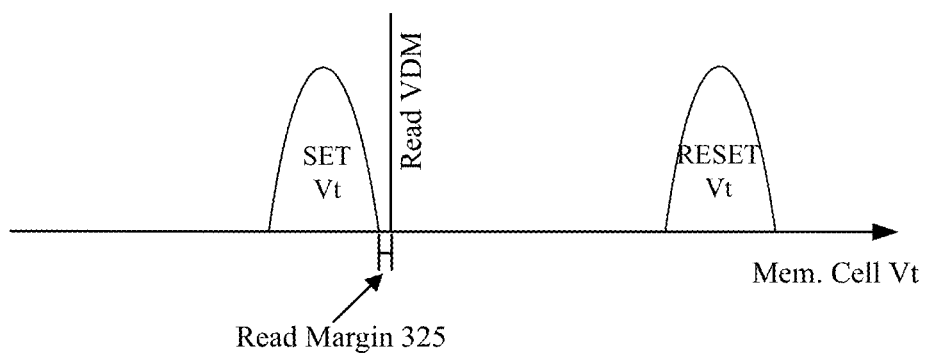
Read Margin 325
*FIG. 3*

Distributions 600
Threshold Voltage Distribution 610
(0 Bias Cycles)
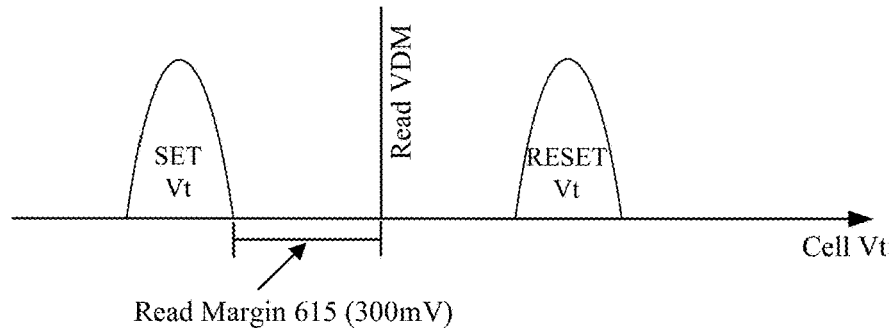
Read Margin 615 (300mV)
Threshold Voltage Distribution 620
(1e+6 Bias Cycles / without C-cell Voltage Bias)
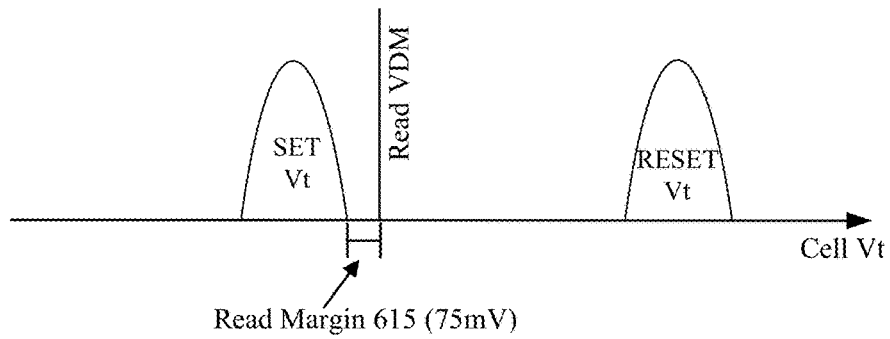
Read Margin 615 (75mV)
Threshold Voltage Distribution 630
(1e+6 Bias Cycles / with C-cell Voltage Bias)
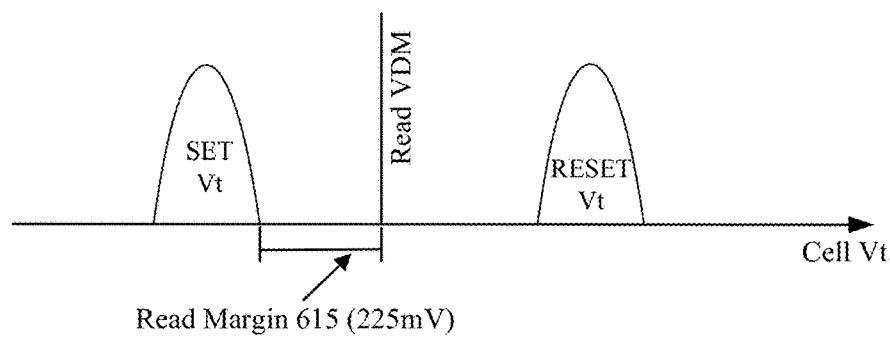
Read Margin 615 (225mV)
*FIG. 6*

800

SELECT A FIRST MEMORY CELL COUPLED WITH A FIRST WORD-LINE AND A BIT-LINE FOR A WRITE OPERATION
802

DE-SELECT A SECOND MEMORY CELL COUPLED WITH A SECOND WORD-LINE AND THE BIT-LINE FOR THE WRITE OPERATION
804

APPLY A FIRST BIAS VOLTAGE TO THE FIRST WORD-LINE AND A SECOND BIAS VOLTAGE TO THE BIT-LINE DURING THE WRITE OPERATION TO PROGRAM THE FIRST MEMORY CELL
806

APPLY A THIRD BIAS VOLTAGE TO THE SECOND WORD-LINE DURING THE WRITE OPERATION TO REDUCE VOLTAGE BIAS TO THE SECOND MEMORY CELL DUE TO THE SECOND BIAS VOLTAGE APPLIED TO THE BIT-LINE TO PROGRAM THE FIRST MEMORY CELL, THE THIRD BIAS VOLTAGE LESS THAN THE SECOND BIAS VOLTAGE
808

*FIG. 8*

Storage Medium 900

*Computer Executable Instructions for 800*

FIG. 9

TECHNIQUES TO MITIGATE BIAS DRIFT FOR A MEMORY DEVICE

CROSS REFERENCE TO RELATED APPLICATIONS

This application is a continuation of U.S. patent application Ser. No. 15/415,690, filed Jan. 25, 2017, entitled "TECHNIQUES TO MITIGATE BIAS DRIFT FOR A MEMORY DEVICE", and is now U.S. Pat. No. 10,026,460, which is a continuation of U.S. patent application Ser. No. 15/087,762, filed Mar. 31, 2016, entitled "TECHNIQUES TO MITIGATE BIAS DRIFT FOR A MEMORY DEVICE", and is now U.S. Pat. No. 9,589,634. The entire specifications of which are hereby incorporated herein by reference in its entirety.

TECHNICAL FIELD

Examples described herein are generally related to techniques to mitigate bias drift for memory cells included in a memory device.

BACKGROUND

Types of memory such as non-volatile memory may have reliability issues caused by a tendency of a non-volatile memory cell to lose a memory state over time. This loss of memory state over time may be referred to as drift. Drift may be an activated process that may be accelerated over time by temperature or through electric field (e.g., sub-threshold bias voltage across a memory cell).

BRIEF DESCRIPTION OF THE DRAWINGS

FIG. 3 illustrates example first distributions.
FIG. 6 illustrates example second distributions.
FIG. 8 illustrates an example of a logic flow.
FIG. 9 illustrates an example of a storage medium.

DETAILED DESCRIPTION

As contemplated in the present disclosure, drift that may cause a non-volatile memory cell to lose its state may be an activated process accelerated over time via repeated sub-threshold bias voltages across the non-volatile memory cell ("bias-accelerated drift"). A type of non-volatile memory architecture that may include phase change memory (PCM) may be susceptible to bias-accelerated drift. In some examples, PCM may include memory cells composed of a chalcogenide phase change material (e.g., chalcogenide glass). Chalcogenide-based memory cells may face possible reliability issues due to bias-accelerated drift. For example, a chalcogenide-based memory cell's threshold voltage may continue to increase with an increasing number of applied sub-threshold voltages on this type of memory cell. This may happen in a memory architecture where de-selected memory cells receive sub-threshold bias voltage pulses while a selected memory cell on a same bit-line (B-cell) or word-line (A-cell) is accessed. An increasing threshold voltage (Vt) may limit or reduce a read-window margin for memory cells. The limited or reduced read-window margin may lead to higher bit error rates due to stored or set memory cell states having highly drifted Vts. An amount of Vt drift may depend on a total magnitude of a bias voltage pulse and a number of pulses applied to a given memory cell.

A conventional way of handing drift or bias drift may be via use of memory controller initiated read-retries. An intention for read-retries may be capturing or thresholding memory cells having high Vts due to bias-accelerated drift. Another way of handling bias-accelerated drift may be through periodic refreshes to existing addresses for memory cells before these memory cells have Vts that drift beyond an available read window and causes bit errors. Both of these ways of handling bias-accelerated drift may negatively impact system performance (e.g., bandwidth/latency). These negative impacts to system performance may be unacceptable for high performance storage/memory systems. The examples described herein may address the above-mentioned and other challenges.

Figure 1:
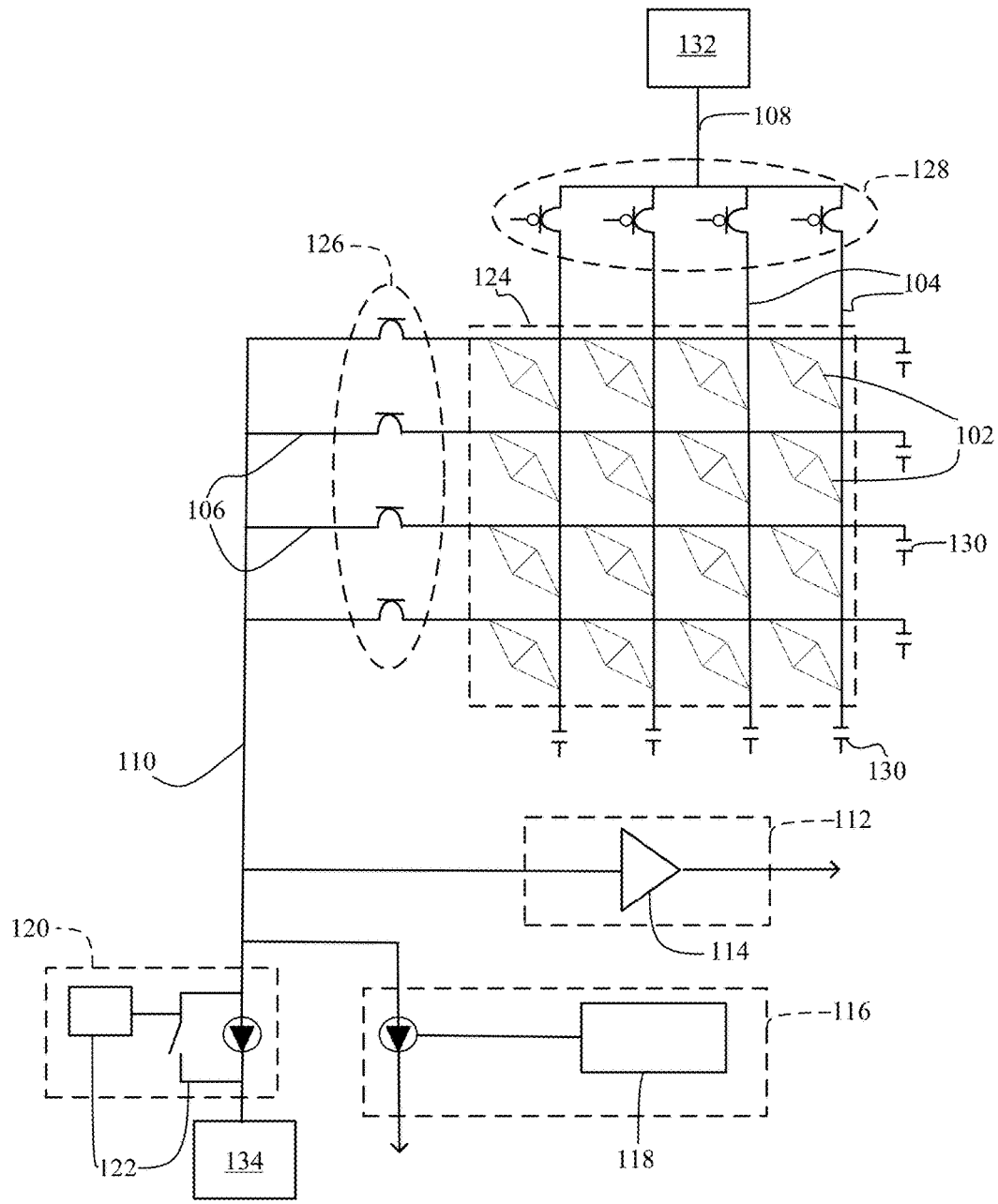
FIG. 1 illustrates an example system.

FIG. 1 illustrates an example system 100. In some examples, as shown in FIG. 1, system 100 includes memory cells 102, which may be configured in an array. Memory cells 102 may include, for example, a phase change material such as, but not limited to, a chalcogenide glass that may be switched between crystalline and amorphous states with the application of heat produced by an electric current. A state (e.g., crystalline/amorphous) of a phase change material may correspond with a logical value (e.g., 1 or 0) of one or more memory cells 102. Subject matter of this disclosure is not limited in this regard, and examples may include other types of architectures for memory devices.

According to some examples, system 100 may also include bit-lines 104 and word-lines 106 coupled to memory cells 102, as shown in FIG. 1. Bit-lines 104 and word-lines 106 may be configured such that each memory cell included in memory cells 102 may be disposed at an intersection of each individual bit-line and word-line. Voltage biases may be applied to a target memory cell of memory cells 102 using a word-line from word-lines 106 and a bit-line from among bit-lines 104 to program the target memory cell for a write operation. Respective bit-line drivers 128 may be coupled to respective bit-lines 104 and respective word-line drivers 126 may be coupled to respective word-lines 106 to facilitate decoding/selection of memory cells 102, as shown in FIG. 1. Also, respective capacitors 130 may be coupled to respective bit-lines 104 and respective word-lines 106, as shown in FIG. 1.

In some examples, system 100 may be a memory device that includes one or more tiles 124. For these examples, the one or more tiles 124 may be arranged as a portion of a memory array that includes word-lines 106, bit-lines 104, and memory cells 102 that may be treated as a discrete unit during a selection operation of a target memory cell. That is, in some examples, each of the one or more tiles 124 is a unit of the memory array that is biased to select the target memory cell (e.g., a bit) in the array. The one or more tiles 124 shown in FIG. 1 may include an array of four word-lines and four bit-lines (4 WL×4 BL); however, other tile sizes may be used in other examples having either equal ratios of word-lines and bit-lines or unequal ratios (e.g., 2 WL for every 1 BL). The one or more tiles 124 may be part of any memory layer of a stacked memory configuration. For example, the one or more tiles 124 may be part of a memory layer formed on another memory layer. Additional word-line drivers and/or bit-lines drivers may be provided for each memory layer.

According to some examples, bit-lines 104 may couple with a bit-line electrode or path 108, which may further couple with a bit-line supply 132 that is configured to provide an electrical supply for bit-lines 104. Also, word-lines 106 may couple to a word-line electrode or path 110, which may further couple with a word-line supply 134 that is configured to provide an electrical supply for word-lines 106. Bit-line electrode 108 and the word-line electrode 110 may each be a current path to memory cells 102. Word-line drivers 126 and bit-line drivers 128 may each include single or multiple transistors per electrode according to various examples. For examples where multiple transistors are used for word-line drivers 126 and bit-line drivers 128, the multiple transistors may be coupled to additional voltage supplies using additional word-line and/or bit-line electrodes that may similarly comport with examples described herein. For example, a first word-line electrode may provide a first voltage supply to one or more selected memory cells and second word-line electrode may provide a second voltage supply to one or more de-selected memory cells.

In some examples, system 100 includes sensing circuitry 112 coupled to word-line electrode 110. For these examples, sensing circuitry 112 may use word-line electrode 110 as an electrical node for performing a read operation, such as a sense operation, of one or more memory cells included in memory cells 102. Sensing circuitry 112 may include a voltage comparator 114. For example, sensing circuitry 112 may include a word-line load connected to word-line electrode 110 to convert a current on the word-line electrode 110 to a voltage that is a first input to the voltage comparator 114. An equivalent word-line load may be connected to a reference current (not shown) to provide a voltage that is a second input to voltage comparator 114. When a particular word-line and bit-line are selected in system 100, the word-line load on word-line electrode 110 may convert the current on the selected word-line to a voltage. Leakage components of the current may be mitigated by respectively selecting a bias voltage for all other unselected word-lines and bit-lines for de-selected memory cells of memory cells 102 that may reduce or minimize leakage. Capacitive components of the current may be mitigated by allowing sufficient time for the capacitive components to dissipate. The current that is converted to the first input to voltage comparator 114 may correspond with the current of the selected or target memory cell. The reference current may be selected such that the current of the target or selected memory cell is lower than the reference current before snap-back of the target or selected memory cell and higher than the reference current after snap-back of the target memory cell. In this manner, an output of voltage comparator 114 may be indicative of a state of the target or selected memory cell. A latch (not shown) may be coupled to the voltage comparator 114 to store information associated with the read operation.

According to some examples, system 100 may also include write circuitry 116 coupled to word-line electrode 110. Write circuitry 116 may use word-line electrode 110 as an electrical node for performing a write operation, such as a SET or RESET operation, of one or more memory cells from among memory cells 102. Write circuitry 116 may include a current profile generator 118 that generates a current profile for performing the write operation.

In some examples, memory device 100 may also include components of a selection module 120 coupled to word-line electrode 110. Current-limiting circuitry 122 of selection module 120 may be coupled to word-line electrode 110 to facilitate a selection operation of one or more memory cells of memory cells 102 using word-line electrode 110. The selection operation may precede a read/write operation and place the target or selected memory cell in a state to receive a read/write operation. During selection, a targeted memory cell may be moved from a sub-threshold region of operation to a region of operation above a threshold region of operation by applying a voltage bias across the target or selected memory cell. The voltage bias to achieve selection of the targeted memory cell is provided by word-line and bit-line driver circuitry (e.g., of the selection module 120) of the respective word-line and bit-line for the targeted memory cell in conjunction with current-limiting circuitry 122. Word-line and bit-line bias for the respective word-line and bit-line may be chosen such that, in combination, an overall voltage bias is applied across the target or selected memory cell that is sufficient to bring the targeted or selected memory cell above a threshold voltage (Vt). In the present example, "above Vt" may refer to a region of operation of a target or selected memory cell that is capable of conducting sufficient current for a write operation, although a smaller current may maintain the target or selected memory cell in the region of operation. The transition from sub-threshold to Vt or above a Vt region may involve a 'snap-back' event where the voltage sustained by the target cell for a given current through the cell is suddenly reduced. Current limiting circuitry 122 may limit the current of word-line electrode 110 to prevent damaging the target or selected memory cell with excessive current. That is, limiting the maximum current of word-line electrode 110 may also limit the maximum current through the memory cells 102. The limiting function may be ineffective during a time that word-line electrode 110 and a word-line decoding path of the target word-line are charging to a steady state.

According to some examples, current-limiting circuitry 122 may be placed on whichever of word-line electrode 110 or bit-line electrode 108 that has a lower capacitance in order to reduce or minimize a transient current after snap-back of one or more memory cells 102 to a level that reduces damage or disturbance of memory cells 102. In the example shown in FIG. 1, current-limiting circuitry 122 is placed on word-line electrode 110.

In some examples, current-limiting circuitry 122 may include a current mirror circuit. Current-limiting circuitry 122 may include a transistor gate that is configured to limit a current of word-line electrode 110 to a maximum current level. For example, the transistor may be an n-type transistor having a gate that is controlled to an analog level such that the transistor delivers up to a maximum desired current. Current-limiting circuitry 122 may be enabled by applying a gate voltage to the transistor. Selection module 120 may include additional control circuitry to facilitate decoding of a target memory cell of the one or more memory cells 102 such that the target or selected memory cell is moved from a subthreshold region of operation to a region of operation above Vt, where Vt is a function of current.

Although example types of memory included in system 100 have been described as including non-volatile types of memory such as PCM, this disclosure is not limited to PCM. In some examples other types of non-volatile memory including, but not limited to, types of volatile memory such as those associated with NAND or NOR technologies are contemplated by this disclosure. Also, other non-volatile types of memory included in a 3-D cross-point memory architecture that may be byte addressable are contemplated by this disclosure. These block addressable or byte addressable non-volatile types of memory may include, but are not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

Figure 2:
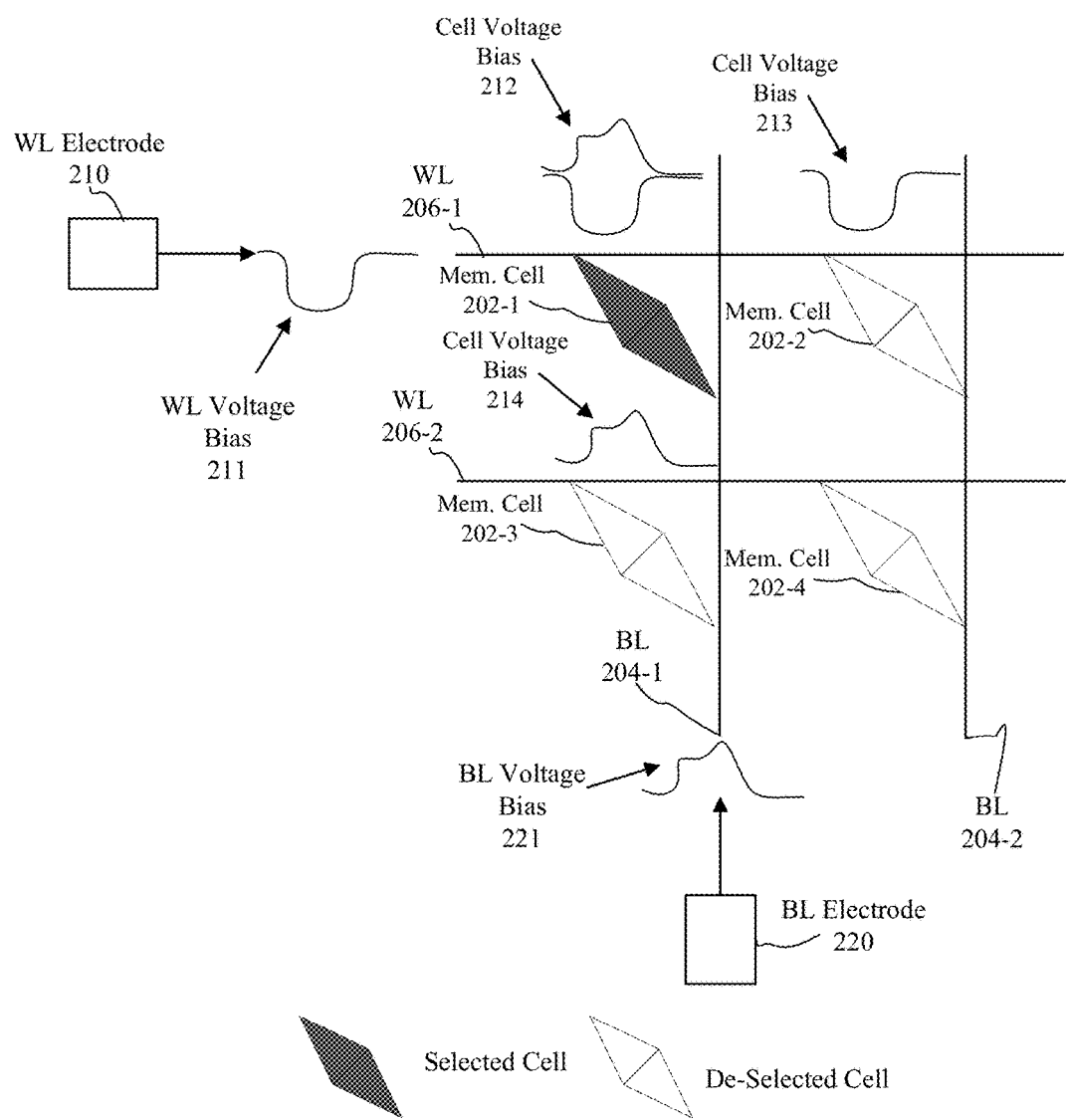
FIG. 2 illustrates an example first array portion.

FIG. 2 illustrates an example array portion 200. In some examples, array portion 200 as shown in FIG. 2, includes memory cells 202-1 to 202-4, bit-lines (BLs) 204-1, 204-2 and word-lines (WLs) 206-1, 206-2. Array portion 200 may have memory cells 202-1 to 202-4 arranged to be at intersections between WLs and BLs that may be metal lines used for access (write or read operations) to these memory cells. Similar to as described above for system 100, a targeted memory cell of memory cells 202-1 to 202-4 may be selected by applying a relevant voltage bias across one of WLs 206-1 or 206-2 and one of BLs 204-1 or 204-2 such that a total differential voltage across the selected memory cell exceeds a Vt for the selected memory cell during an access. For example, during a write operation, bias voltages on a given WL of WLs 206-1 or 206-2 (e.g., provided by a WL electrode) or a given BL of BLs 204-1 or 204-2 (e.g., provided by a BL electrode) may be adjusted to allow for sufficient current to flow through the selected memory cell to program the selected memory cell into a correct state (e.g., SET or RESET).

According to some examples, shaded memory cell 202-1 may be a selected memory cell. As the selected memory cell, memory cell 202-1 may receive a total bias voltage to deliver sufficient current and voltage for programming memory cell 202-1 during a write operation. As shown in FIG. 2, the total bias voltage (e.g., 7V) may be delivered over WL 206-1 from WL electrode 210 that provides WL voltage bias 211 and over BL 204-1 from BL electrode 220 that provides BL voltage bias 221 to generate cell voltage bias 212 at memory cell 202-1 from a combination of WL voltage bias 211 and BL voltage bias 221. In some examples, WL voltage bias 211, as shown in FIG. 2, may be a negative voltage bias and BL voltage bias 221 may have a positive voltage bias. Unshaded memory cells 202-2, 202-3 and 202-4 may be de-selected memory cells. De-selected memory cell 202-2 on the same WL as selected memory cell 202-1 may be referred to as an A-cell. De-selected memory cell 202-3 on the same BL as selected memory cell 202-1 may be referred to as a B-cell. Cell voltage signal 213 may represent a first portion of the total bias voltage delivered to selected memory cell 202-1 that is also delivered to memory cell 202-2 over WL 206-1 from WL electrode 210 to provide WL voltage bias 211. Cell voltage bias 214 may represent a second portion of the total bias voltage delivered to selected memory cell 202-1 that is also delivered to memory cell 202-3 over BL 204-1 from BL electrode 220 to provide BL voltage bias 221.

In some examples, WL voltage bias 211 and BL voltage bias 221, when taken separately, are both at sub-threshold voltage biases (e.g., below Vt). These sub-threshold voltage biases may vary in magnitude and duration depending on an operation being performed on a selected memory cell. Typically, a highest amount of voltage bias may be required for a type of write operation such as a RESET operation where a large amount of current may be required though a selected memory cell for programming the selected memory cell. At least a portion of this higher amount of voltage bias for a RESET operation may be delivered to de-selected memory cells in a similar manner as mentioned above for de-selected memory cells 202-2 and 202-3. This higher amount of voltage bias for the RESET operation may cause bias-accelerated drift.

FIG. 3 illustrates example distributions 300. In some examples, as shown in FIG. 3, distributions 300 includes a first threshold distribution 310 (pre-drift) and a second threshold distribution 320 (post-drift). For these examples, threshold distributions 310 and 320 may reflect bias-accelerated drift for de-selected memory cells caused primarily when these de-selected memory cells receive at least a portion of voltage bias for a write operation such as a RESET operation. For example, as mentioned above for de-selected memory cells 202-2 or 202-3 shown in FIG. 2.

Figure 4:
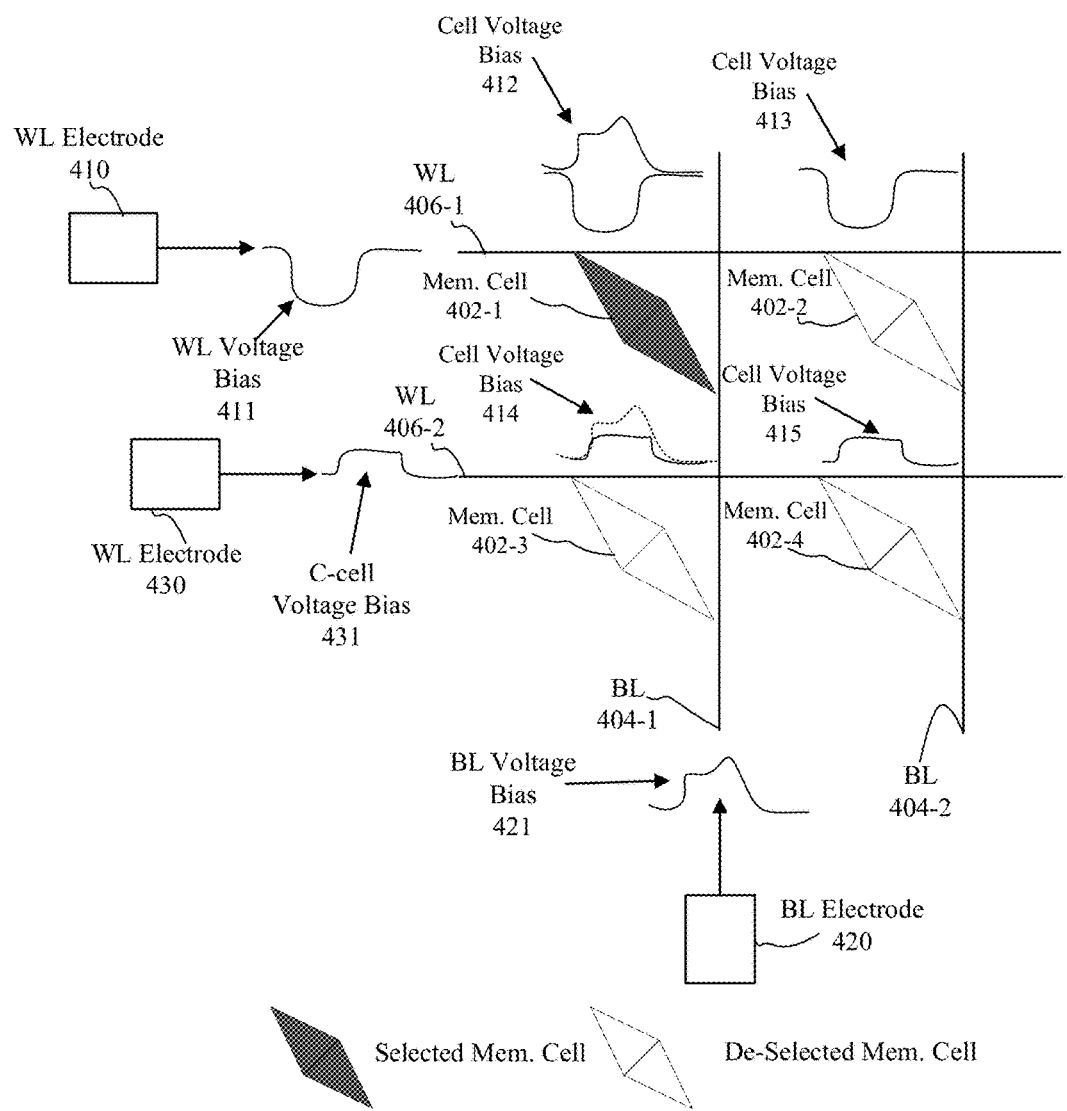
FIG. 4 illustrates an example second array portion.

In some examples, accumulation of multiple sub-threshold bias voltages on de-selected memory cells may cause a loss of an available read window or margin. For example, as shown in FIG. 3, read margin 325 between SET Vt and read demarcation voltage (VDM) for threshold distribution 320 (post-drift) is substantially smaller or narrower than read margin 315 for threshold distribution 310 (pre-drift). The smaller or narrower read margin 325 may ultimately result in higher bit error rates for a programmed read VDM FIG. 4 illustrates an example array portion 400. In some examples, array portion 400 as shown in FIG. 4, includes memory cells 402-1 to 402-4, BLs 404-1, 404-2 and WLs 406-1, 406-2. Similar to array portion 200 shown in FIG. 2, array portion 400 may be part of a 3-D cross-point memory array and may operate in a similar manner as described above for array portion 200. However, different than what was described above for array portion 200, a biasing scheme may be implemented that mitigates or reduces bias-accelerated drift.

According to some examples, to mitigate bias-accelerated drift, an additional positive voltage may be applied on a WL of deselected memory cells (e.g., provided by a second WL electrode). For example, as shown in FIG. 4, memory cell 402-1 is the selected memory cell and receives a total bias voltage (e.g., 7 volts (V)) from WL voltage bias 411 provided by WL electrode 410 and BL voltage bias 421 provided BL electrode 420 to generate cell voltage bias 412. However, the additional positive voltage from a second WL electrode 430 to provide C-cell voltage bias 431 may be applied on WL 406-2 to reduce differential voltage bias on memory cell 402-3 caused by BL voltage bias 421 provided by BL electrode 420. The solid line portion of cell voltage bias 414 may represent the additional positive voltage that reduces differential voltage bias on memory cell 402-3 caused by BL voltage bias 421 that is shown as the dotted-line portion of cell voltage bias 414. As shown in FIG. 4, C-cell voltage bias 431 may be less than BL voltage bias 421 (e.g., 1V vs. 3.5V). C-cell voltage bias 431 may also be turned on or provided to de-selected memory cells 402-3 and 402-4 during a selection operation of a write algorithm to mitigate possible false selection of these memory cells when selecting memory cell 402-1.

In some examples, C-cell voltage bias 431 may be enabled or applied to de-selected memory cell 402-3 during a write operation such as a RESET operation. The RESET operation may have a voltage bias on a memory cell that may be substantially higher than another type of write operation such as a SET operation to achieve a required current delivery. Also, the scheme shown in FIG. 4 may mainly reduce bias-accelerated drift impacts on B-cells (e.g., memory cell 402-3) since a higher voltage bias may be applied on BLs during write operations. As described in more detail below, a reduction of 1V of voltage bias across a given memory cell may noticeably mitigate bias-accelerated drift when the number of bias cycles surpasses 1,000 and substantially mitigate bias-accelerated drift when the number of bias cycles surpasses 1,000,000.

According to some examples, C-cell voltage bias 431 applied to WL 406-2 from WL electrode 430 does not impact differential biases on both memory cells 402-1 and 402-2 as these memory cells are on WL 406-1. For example, as shown in FIG. 4, cell voltage biases 412 and 413 do not include the positive bias voltage from C-cell voltage bias 431. Also, since memory cell 402-4 is not subject to voltage bias from BL voltage bias 421, C-cell voltage bias 431 indicates only the relatively smaller voltage bias applied to memory cell 402-4.

Figure 5:
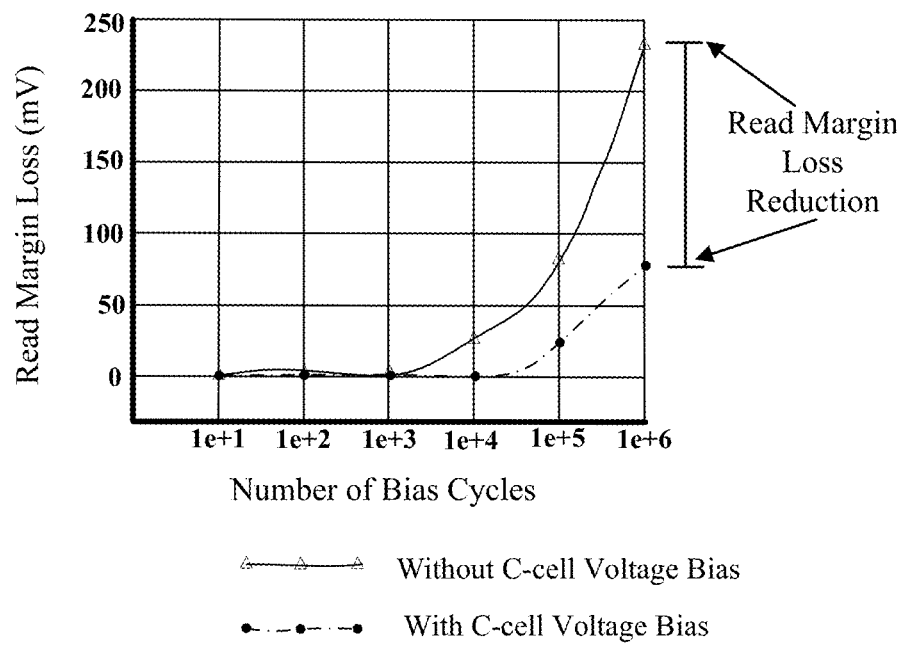
FIG. 5 illustrates an example graph.

FIG. 5 illustrates an example graph 500. In some examples, as shown in FIG. 5, graph 500 depicts a comparison of read margin loss in millivolts (mV) for a scheme that includes application of a C-cell voltage bias as mentioned above for FIG. 4 and for a scheme that does not include an application of a C-cell voltage bias. For these examples, an applied C-cell voltage bias may be 1V. The scheme, for example, may be applied to 3-D cross-point memory architecture including PCM such as chalcogenide glass.

In some examples, as shown in FIG. 5, a noticeable reduction in read margin loss starts to occur when a number of bias cycles exceeds 1,000. Also, at 1,000,000 bias cycles read margin loss reduction is shown in graph 500 to be approximately 150 mV.

FIG. 6 illustrates example distributions 600. In some examples, distributions include a first threshold distribution 610 (0 bias cycles), a second threshold distribution 620 (1e+6 bias cycles/without C-cell bias voltage) and a third threshold distribution 630 (1e+6 bias cycles/with C-cell bias voltage. For these examples, threshold distributions 610, 620 and 630 may reflect bias-accelerated drift for de-selected memory cells caused primarily when these de-selected memory cells receive at least a portion of voltage bias from a BL voltage bias for a programming or write operation such as a RESET operation. For example, as mentioned above for de-selected memory cell 402-3 shown in FIG. 4.

In some examples, threshold voltage distribution 610 indicates that read margin 615 may have a read margin or window between SET Vt and read VDM of 300 mV when 0 bias cycles have occurred. Threshold voltage distribution 620 indicates that read margin 615 may have been reduced to 75 mV after 1e+6 (1,000,000) bias cycles when no C-cell bias voltage has been applied to de-selected memory cells. Comparatively, threshold voltage distribution 630 shows that read margin 615 has only been reduced to 225 mV after 1e+6 bias cycles. For these examples, a 2× less reduction (75 mV vs. 150 mV) in read margin reduction may be achieved when applying a C-cell bias voltage during a RESET operation. A smaller read margin reduction may lead to fewer bit errors and a need for fewer read retries. Some voltage overhead may be needed to deliver or apply C-cell voltage bias to de-selected memory cells during RESET operations. However, fewer bit errors and fewer read retries may be more beneficial to system performance when compared to costs associated with additional voltage overhead.

According to some examples, a scheme may be implemented to selectively reduce actual bit-line voltage bias applied to memory cells included in a non-volatile memory device (e.g., arranged as a 3-D cross-point memory array). For these examples, at least some memory cells may be programmed using a lower bias voltage for RESET operations (e.g., memory cells physically located closer to bit-line drivers). For these lower bias voltage memory cells, a C-cell bias voltage may not be applied to de-selected memory cells on the same BL. Also, other memory cells needing a higher bias voltage for RESET operations (e.g., memory cells physically located farthest or farther from bit-line drivers) may have a C-cell bias voltage applied to de-selected memory cells on the same BL. This scheme may strike a balance between both reducing voltage overhead and improving performance by reducing bias-accelerated drift for de-selected memory cells subject to higher levels of bias voltage during write operations such a RESET operation.

Figure 7:
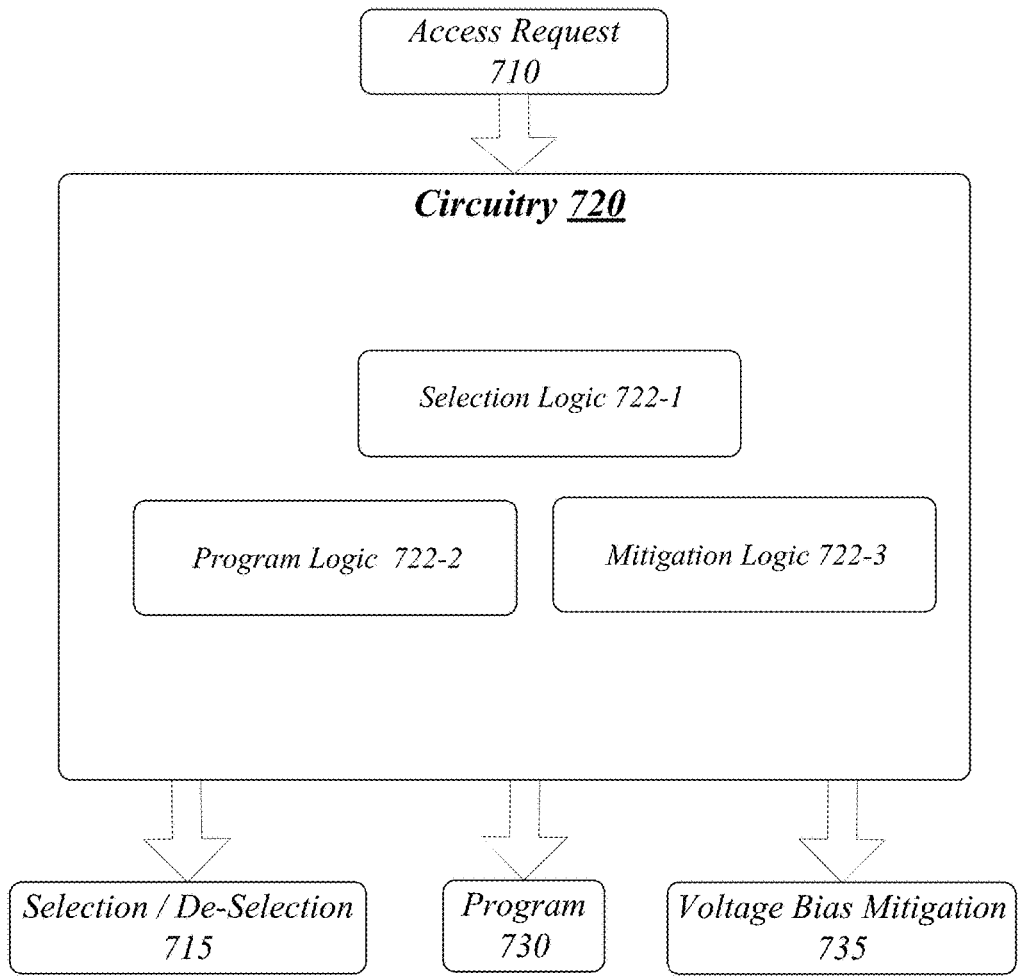
FIG. 7 illustrates an example block diagram for an apparatus.

FIG. 7 illustrates an example block diagram for an apparatus 700. Although apparatus 700 shown in FIG. 7 has a limited number of elements in a certain topology, it may be appreciated that the apparatus 700 may include more or less elements in alternate topologies as desired for a given implementation.

The apparatus 700 may be supported by circuitry 720 and apparatus 700 may be a controller maintained at a memory device or with a memory system. The memory device may be coupled with or included in a host computing platform. Circuitry 720 may be arranged to execute one or more software or firmware implemented logic, components or modules 722-$a$ (e.g., implemented, at least in part, by a storage controller of a storage device). It is worthy to note that "a" and "b" and "c" and similar designators as used herein are intended to be variables representing any positive integer. Thus, for example, if an implementation sets a value for a=3, then a complete set of software or firmware for logic, components or modules 722-$a$ may include logic 722-1, 722-2 or 722-3. Also, at least a portion of "logic" may be software/firmware stored in computer-readable media, and although the logic is shown in FIG. 7 as discrete boxes, this does not limit logic to storage in distinct computer-readable media components (e.g., a separate memory, etc.).

According to some examples, circuitry 720 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 720 may also include one or more application-specific integrated circuits (ASICs) and at least some logic 722-$a$ may be implemented as hardware elements of these ASICs.

According to some examples, apparatus 700 may include a selection logic 722-1. Selection logic 722-1 may be a logic and/or feature executed by circuitry 720 to select a first memory cell coupled with a first word-line and a bit-line for a write operation and de-select a second memory cell coupled with a second word-line and the bit-line, the second memory cell de-selected for the write operation. For these examples, the selection of the first memory cell and the de-selection of the second memory cell may be responsive to access request 710 and may be initiated via selection/de-selection 715.

In some examples, apparatus 700 may also include a program logic 722-2. Program logic 722-2 may be a logic and/or feature executed by circuitry 720 to cause a first bias voltage to be applied to the first word-line and a second bias voltage to be applied to the bit-line during the write operation to program the first memory cell. For these examples, program 730 may include a RESET operation to program the first memory cell.

According to some examples, apparatus 700 may also include a mitigation logic 722-3. Mitigation logic may be a logic and/or feature executed by circuitry 720 to cause a third bias voltage to be applied to the second word-line during the write operation to provide the third bias voltage to the second memory cell to reduce voltage bias to the second memory cell due to the second bias voltage applied to the bit-line to program the first memory cell, the third bias voltage less that the second bias voltage. For these examples, voltage bias mitigation 735 may cause the third bias voltage to be applied to the second word-line such that voltage bias to the second memory cell may be reduced by at least 1V during the write operation. Examples are not limited to a reduction of at least 1V, other reductions of greater of lesser volts are contemplated.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as apparatus 700. More particularly, logic flow 800 may be implemented by one or more of selection logic 722-1, program logic 722-2 or mitigation logic 722-3.

According to some examples, logic flow 800 at block 802 may select a first memory cell coupled with a first word-line and a bit-line for a write operation. For these examples, selection logic 722-1 may select the first memory cell.

In some examples, logic flow 800 at block 804 may de-select a second memory cell coupled with a second word-line and the bit-line for the write operation. For these examples, selection logic 722-1 may de-select the second memory cell.

According to some examples, logic flow 800 at block 806 may apply a first bias voltage to the first word-line and a second bias voltage to the bit-line during the write operation to program the first memory cell. For these examples, program logic 722-2 may cause the first and second bias voltages to be applied to the first word-line and the bit-line to program the first memory cell.

In some examples, logic flow 800 at block 808 may apply a third bias voltage to the second word-line during the write operation to reduce voltage bias to the second memory cell due to the second bias voltage applied to the bit-line to program the first memory cell, the third bias voltage less than the second bias voltage. For these examples, mitigation logic 722-3 may cause the third bias voltage to be applied to the second word-line.

FIG. 9 illustrates an example of a first storage medium. As shown in FIG. 9, the first storage medium includes a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
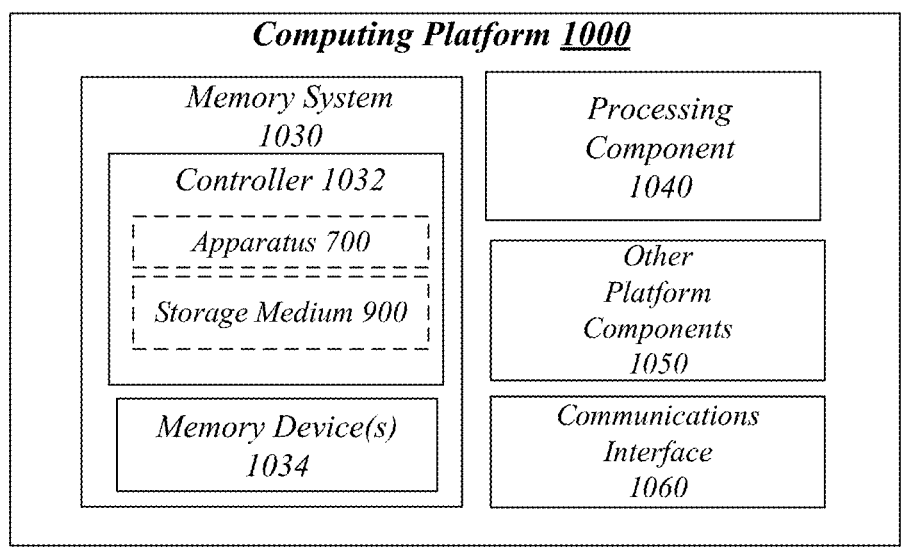
FIG. 10 illustrates an example computing platform.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may include a controller 1032 and memory devices(s) 1034. For these examples, logic and/or features resident at or located at controller 1032 may execute at least some processing operations or logic for apparatus 700 and may include storage media that includes storage medium 900. Also, memory device(s) 1034 may include similar types of non-volatile memory (not shown) that are described above for system 100, array portion 200 or array portion 400 shown in FIGS. 1, 2 and 4. In some examples, controller 1032 may be part of a same die with memory device(s) 1034. In other examples, controller 1032 and memory device(s) 1034 may be located on a same die or integrated circuit with a processor (e.g., included in processing component 1040). In yet other examples, controller 1032 may be in a separate die or integrated circuit coupled with memory device(s) 1034.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or storage system 1030 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example memory device may include a first memory cell coupled with a first word-line and a bit-line. The first memory cell may be selected for a write operation. The memory device may also include a second memory cell coupled with a second word-line and the bit-line. The second memory cell may be de-selected for the write operation. The memory device may also include a first word-line electrode coupled with the first word-line to provide a first bias voltage to the first memory cell during the write operation. The memory device may also include a bit-line electrode coupled with the bit-line to provide a second bias voltage to the first memory cell during the write operation. The first and second bias voltages may cause the first memory cell to be programmed. The memory device may also include a second word-line electrode coupled with the second word-line to provide a third bias voltage to the second memory cell during the write operation to reduce voltage bias to the second memory cell due to the second bias voltage applied to the bit-line. The third bias voltage may be less than the second bias voltage.

Example 2

The memory device of example 1, the first and third bias voltages may be separate positive voltage biases.

Example 3

The memory device of example 1, the third bias voltage may reduce voltage bias to the second memory cell by at least 1 volt during the write operation.

Example 4

The memory device of example 1, the write operation may be a RESET operation to program the first memory cell.

Example 5

The memory device of example 1 may also include one or more additional memory cells coupled with the bit-line. The memory device may also include a bit-line driver coupled with the bit-line. For these examples, the first memory cell may be physically located on the bit-line in a position farthest away from the bit-line driver as compared to the second memory cell and the one or more additional memory cells.

Example 6

The memory device of example 1, the first and second memory cells may include non-volatile memory.

Example 7

The memory device of example 6, the non-volatile memory may include phase change memory that uses chalcogenide phase change material, flash memory, ferroelectric memory, SONOS memory, polymer memory, FeTRAM, FeRAM, ovonic memory, nanowire, EEPROM, PCM, memristors or STT-MRAM.

Example 8

An example method may include selecting a first memory cell coupled with a first word-line and a bit-line for a write operation. The method may also include de-selecting a second memory cell coupled with a second word-line and the bit-line for the write operation. The method may also include applying a first bias voltage to the first word-line and a second bias voltage to the bit-line during the write operation to program the first memory cell. The method may also include applying a third bias voltage to the second word-line during the write operation to reduce voltage bias to the second memory cell due to the second bias voltage applied to the bit-line to program the first memory cell. For these examples, the third bias voltage may be less than the second bias voltage.

Example 10

The method of example 8, the first and third bias voltages may be separate positive voltage biases.

Example 11

The method of example 8, the third bias voltage may reduce voltage bias to the second memory cell by at least 1 volt during the write operation.

Example 12

The method of example 8, the write operation may be a RESET operation to program the first memory cell.

Example 13

The method of example 8, the first memory cell may be physically located on the bit-line in a position farthest away from a bit-line driver for the bit-line as compared to the second memory cell and one or more additional memory cells also coupled with the bit-line.

Example 13

The method of example 8, the first and second memory cells may include non-volatile memory.

Example 14

The method of example 13, the non-volatile memory may include phase change memory that uses chalcogenide phase change material, flash memory, ferroelectric memory, SONOS memory, polymer memory, FeTRAM, FeRAM, ovonic memory, nanowire, EEPROM, PCM, memristors or STT-MRAM.

Example 15

An example at least one machine readable medium may include a plurality of instructions that in response to being executed by a system may cause the system to carry out a method according to any one of examples 8 to 14.

Example 16

An example apparatus may include means for performing the methods of any one of examples 8 to 14.

Example 17

An example system may include a first memory cell coupled with a first word-line and a bit-line. The first memory cell may be selected for a write operation. The system may also include a second memory cell coupled with a second word-line and the bit-line. The second memory cell may be de-selected for the write operation. The system may also include a controller that includes logic, at least a portion of which is implemented as hardware. For these examples, the logic may cause a first bias voltage to be applied to the first word-line and a second bias voltage to be applied to the bit-line during the write operation to program the first memory cell. The logic may also cause a third bias voltage to be applied to the second word-line during the write operation to provide the third bias voltage to the second memory cell to reduce voltage bias to the second memory cell due to the second bias voltage applied to the bit-line to program the first memory cell, the third bias voltage less that the second bias voltage.

Example 18

The system of example 17, the first and third bias voltages may be separate positive voltage biases.

Example 19

The system of example 17, the third bias voltage may reduce voltage bias to the second memory cell by at least 1 volt during the write operation.

Example 20

The system of example 17, the write operation may be a RESET operation to program the first memory cell.

Example 21

The system of example 17 may also include one or more additional memory cells coupled with the bit-line. The system may also include a bit-line driver coupled with the bit-line. For these examples, the first memory cell may be physically located on the bit-line in a position farthest away from the bit-line driver as compared to the second memory cell and the one or more additional memory cells.

Example 23

The system of example 17, the first and second memory cells may include non-volatile memory.

Example 24

The system of example 22, the non-volatile memory may include phase change memory that uses chalcogenide phase change material, flash memory, ferroelectric memory, SONOS memory, polymer memory, FeTRAM, FeRAM, ovonic memory, nanowire, EEPROM, PCM, memristors or STT-MRAM.

Example 25

The system of example 17 may also include one or more of one or more processors communicatively coupled to the controller, a network interface communicatively coupled to the system, a battery coupled to the system or a display communicatively coupled to the system.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
    a controller for a memory device, the controller to include logic, at least a portion of which is implemented as hardware, the logic to:
        cause a first bias voltage to be applied to a first word-line coupled with a first memory cell included in the memory device and cause a second bias voltage to be applied to a bit-line coupled with the first memory cell and a second memory cell included in the memory device, the first bias voltage and the second bias voltage to be applied during a write operation to program the first memory cell; and cause a third bias voltage to be applied to a second word-line coupled with the second memory cell during the write operation to program the first memory cell, the third bias voltage less that the second bias voltage.

2. The apparatus of claim 1, comprising the first and third bias voltages are separate positive voltage biases.

3. The apparatus of claim 1, comprising the third bias voltage applied to the second word-line to cause a reduction in voltage bias to the second memory cell, the voltage bias to the second memory cell to be generated as the second bias voltage is applied to the bit-line to program the first memory cell.

4. The apparatus of claim 3, comprising the third bias voltage to reduce voltage bias to the second memory cell by at least 1 volt during the write operation.

5. The apparatus of claim 1, the write operation comprising a RESET operation to program the first memory cell.

6. The apparatus of claim 1, further comprising the memory device, wherein one or more additional memory cells are included in the memory device, the one or more additional memory cells coupled with the bit-line, the memory device also includes a bit-line driver coupled with the bit-line and the first memory cell included in the memory device is physically located on the bit-line in a position farthest away from the bit-line driver as compared to the second memory cell and the one or more additional memory cells.

7. The apparatus of claim 1, the first and second memory cells of the memory device include non-volatile memory, wherein the non-volatile memory comprises phase change memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

8. The apparatus of claim 1, comprising one or more of:
one or more processors communicatively coupled to the controller;
a network interface communicatively coupled to the apparatus;
a battery coupled to the apparatus; or
a display communicatively coupled to the apparatus.

9. An apparatus comprising:
a controller for a memory device, the controller to include logic, at least a portion of which is implemented as hardware, the logic to:
cause a first bias voltage to be applied to a first bit-line coupled with a first memory cell included in the memory device and cause a second bias voltage to be applied to a word-line coupled with the first memory cell and a second memory cell included in the memory device, the first bias voltage and the second bias voltage to be applied during a write operation to program the first memory cell; and
cause a third bias voltage to be applied to a second bit-line coupled with the second memory cell during the write operation to program the first memory cell, the third bias voltage less that the second bias voltage.

10. The apparatus of claim 9, comprising the first and third bias voltages are separate positive voltage biases.

11. The apparatus of claim 9, comprising the third bias voltage applied to the second bit-line to cause a reduction in voltage bias to the second memory cell, the voltage bias to the second memory cell to be generated as the second bias voltage is applied to the word-line to program the first memory cell.

12. The apparatus of claim 11, comprising the third bias voltage to reduce voltage bias to the second memory cell by at least 1 volt during the write operation.

13. The apparatus of claim 9, the write operation comprising a RESET operation to program the first memory cell.

14. The apparatus of claim 9, further comprising the memory device, wherein one or more additional memory cells are included in the memory device, the one or more additional memory cells coupled with the word-line, the memory device also includes a word-line driver coupled with the word-line and the first memory cell included in the memory device is physically located on the word-line in a position farthest away from the word-line driver as compared to the second memory cell and the one or more additional memory cells.

15. The apparatus of claim 1, the first and second memory cells of the memory device include non-volatile memory, wherein the non-volatile memory comprises phase change memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

16. A method comprising:
causing, by a controller for a memory device, a first bias voltage to be applied to a first word-line coupled with a first memory cell included in the memory device;
causing a second bias voltage to be applied to a bit-line coupled with the first memory cell and a second memory cell included in the memory device, the first bias voltage and the second bias voltage to be applied during a write operation to program the first memory cell;
causing a third bias voltage to be applied to a second word-line coupled with the second memory cell during the write operation to program the first memory cell, the third bias voltage less that the second bias voltage.

17. The method of claim 16, comprising the first and third bias voltages are separate positive voltage biases.

18. The method of claim 16, comprising applying the third bias voltage to the second word-line to cause a reduction in voltage bias to the second memory cell, the voltage bias to the second memory cell generated as the second bias voltage is applied to the bit-line to program the first memory cell.

19. The method of claim 16, the write operation comprising a RESET operation to program the first memory cell.

20. A method comprising:
causing, by a controller for a memory device, a first bias voltage to be applied to a first bit-line coupled with a first memory cell included in the memory device;
causing a second bias voltage to be applied to a word-line coupled with the first memory cell and a second memory cell included in the memory device, the first bias voltage and the second bias voltage to be applied during a write operation to program the first memory cell;

causing a third bias voltage to be applied to a second bit-line coupled with the second memory cell during the write operation to program the first memory cell, the third bias voltage less that the second bias voltage.

21. The method of claim 20, comprising the first and third bias voltages are separate positive voltage biases.

22. The method of claim 20, comprising applying the third bias voltage to the second bit-line to cause a reduction in voltage bias to the second memory cell, the voltage bias to the second memory cell generated as the second bias voltage is applied to the word-line to program the first memory cell.

23. The method of claim 20, the write operation comprising a RESET operation to program the first memory cell.

* * * * *